United States Patent

[11] 3,590,328

[72] Inventors Bert L. Frescura
Los Altos;
Nicholas G. Spilling, Sunnyvale; Harry P. Vossen, Santa Clara, all of, Calif.

[21] Appl. No. 872,204
[22] Filed Oct. 29, 1969
[45] Patented June 29, 1971
[73] Assignee Hewlett-Packard Company
Palo-Alto, Calif.

[54] MODULE ASSEMBLY AND METHOD OF MAKING SAME
10 Claims, 3 Drawing Figs.

[52] U.S. Cl. .......... 317/100, 317/101 A, 315/169
[51] Int. Cl. .......... H02b 1/00
[50] Field of Search .......... 317/100, 101N, 101A; 340/324, 366; 315/169

[56] References Cited

UNITED STATES PATENTS 3,240,990 3/1966 Blank et al. .......... 315/169

*Primary Examiner*—David Smith, Jr.
*Attorney*—Stephen P Fox

ABSTRACT: A module assembly includes a sheetlike aluminum substrate, a plurality of semiconductor light emitting elements bonded to one edge of the substrate, and an integrated circuit and metal plane conductor pattern bonded to the lateral surface of the substrate. The conductor pattern and substrate are bonded together by a Teflon FEP coated polyimide film disposed between them. The conductor pattern electrically interconnects the light emitting elements and the integrated circuit and provides input terminals connectable to an external signal source. Selected areas of the module are encapsulated with a very thin layer of silicone compound which is secured to the substrate. The module components are fabricated by bonding and encapsulating steps which permit formation of a thin, mechanically sturdy and integral unit without causing thermal stress in the semiconductor components thereof.

INVENTORS

BERT L. FRESCURA
NICHOLAS G. SPILLING
HARRY P. VOSSEN

BY Stephen P. Fox
AGENT

INVENTORS

BERT L. FRESCURA
NICHOLAS G. SPILLING
HARRY P. VOSSEN

BY Stephen P. Fox
AGENT

MODULE ASSEMBLY AND METHOD OF MAKING SAME

BACKGROUND OF THE INVENTION

The modular packaging of a plurality of discrete display elements and control circuitry therefor is disclosed in a copending patent application Ser. No. 872,031, filed Oct. 29, 1969 in the names of J. Barrett, H. Borden and E. Loebner, entitled "-Hybrid Integrated Circuit Module," and assigned to the same assignee as the present invention. As stated therein, display modules may be used as basic building blocks capable of low cost mass production. A plurality of modules may be stacked adjacent to one another to produce a large display field for indicating a wide variety of information with high resolution. In the aforementioned patent application, each module includes a thin substrate having control circuitry disposed on a lateral surface thereof and a linear array of light emitting elements arranged on an edge of the substrate to form a viewing plane perpendicular to the lateral surface. The light emitting elements are mounted adjacent to one another in a linear array with very small center-to-center spacings, typically 0.100 inch. In order to maintain this close spacing between light emitting elements of adjacently stacked modules, it is also required that the total thickness of the module, including the substrate and control circuitry, be very small and on the order of 0.100 inch.

The miniaturized construction of a module, such as the type described above, presents a number of problems. The module must be thin yet mechanically sturdy. It is desirable that the module be an integral unit formed as a plug-in replacable part which is easily connectable to external signal input terminals. The module should provide heat sinking capability to dissipate power consumed and thereby limit temperature rise. Also, the module should be capable of fabrication in a manner which avoids excessive and damaging thermal stress on the various semiconductor elements and other component parts thereof.

SUMMARY OF THE INVENTION

The module of the present invention, in the illustrated embodiment, includes a substrate formed from a sheet of metal such as aluminum, which acts as a heat sink and also serves as a common electrical conductor. A plurality of semiconductor indicating elements, such as light emitting diodes are mounted on a metal strip, which in turn is bonded to one edge of the metal substrate in thermal and electrical contact therewith. A semiconductor integrated circuit chip is similarly bonded to a lateral surface of the substrate. A metal plane conductor pattern is bonded to the substrate, but electrically isolated therefrom by a Teflon coated insulating film. The conductor pattern is configured to suitably interconnect the indicating elements and the integrated circuit, and to provide an array of plug-in terminals along an edge of the substrate. A silicone compound encapsulating material is molded in a thin layer around selected areas of the conductor pattern and substrate. The module formed is a thin and mechanically strong integral unit.

According to the preferred method of fabricating the module, first the metal substrate and the metal plane conductor pattern are bonded together by placing the Teflon FEP coated film therebetween and applying predetermined amounts of heat and pressure to the assembly. Thereafter, selected areas of the assembly are encapsulated in silicone compound, which is formed in a very thin layer and secured to the substrate by molding the silicone compound into holes formed in the substrate. The integrated circuit and the assembly of indicating elements disposed on the mounting strip are then bonded to the metal substrate and connected to the metal plane conductor pattern at a temperature which is lower than that used for the first bonding and encapsulating steps. The module fabricated by this method has a very thin cross-sectional dimension, for example 0.100 inch, yet it is a mechanically strong integral unit. Fabrication is achieved without inducing excessive and harmful thermal stress in the semiconductor integrated circuit and indicating elements.

DESCRIPTION OF THE PREFERRED EMBODIMENT

Figure 1:
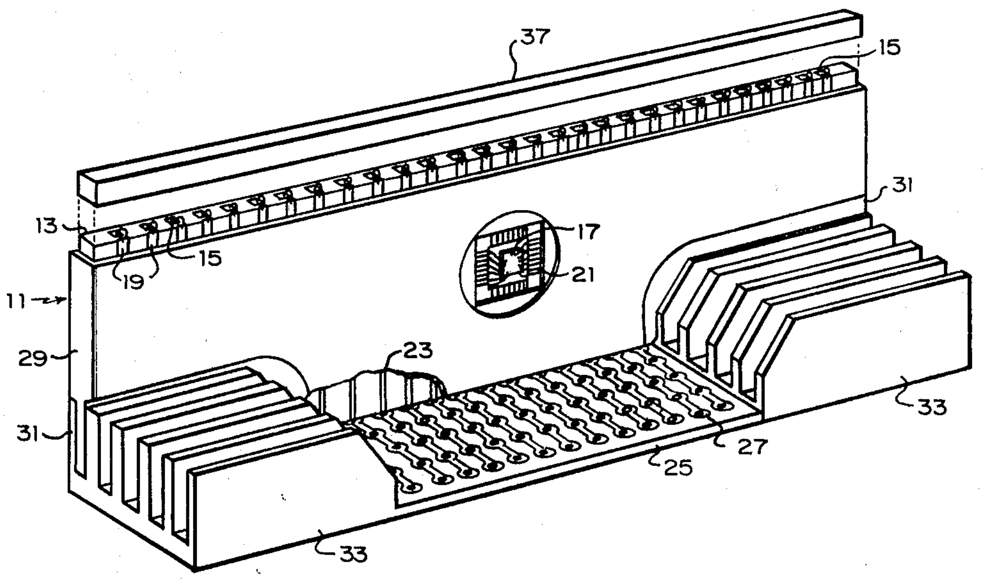
FIG. 1 is a perspective view of the preferred embodiment of module assembly of the present invention shown mounted on a plug-in circuit board and heat sink.

Referring now to FIG. 1, there is shown the module 11 which is formed on a sheetlike aluminum substrate or plate member 13, as hereinafter described. Along the top edge of the substrate 13 there are mounted a plurality of semiconductor indicating elements 15, which may be, for example, light emitting gallium arsenide-phosphide diodes. As shown, the diodes are disposed in a linear array and they are closely spaced to one another, typically with 0.100 inch center-to-center spacings. Mounted on one lateral surface of the substrate 13 is a monolithic integrated circuit chip 17 for controlling the indicating elements 15. The integrated circuit 17 is connected to the indicating elements 15 and to a plurality of input terminals by a metal plane conductor pattern overlaying the lateral surface of the substrate and described later in connection with FIGS. 2 and 3. The conductor pattern includes a first array of contact points 19 which are respectively connected to the indicating elements 15, a second array of contact points 21 arranged around the periphery of the integrated circuit chip 17 for connection thereto, and a third array of contact points 23 which form a plurality of input terminals projecting downwardly from the bottom edge of the substrate 13. The input terminals 23 plug into a printed circuit board 25 and engage signal conductors 27. Only the contact points of the metal plane conductor pattern are exposed to view in FIG. 1, because the module is encapsulated within a thin layer of silicone compound 29, as described later.

As shown in FIG. 1, the lower corners 31 of the substrate are exposed to provide aluminum surfaces for mounting the substrate in thermal contact in the slots of heat sink blocks 33. The slot and the plug-in mounting arrangement for the module enable it to be used as a basic building block. A plurality of modules may be arranged side-by-side in adjacent slots of the heat sink blocks 33, and a plurality of module and heat sink assemblies may be stacked side-by-side and end-on-end to produce a large display having a viewing field in a plane perpendicular to the lateral surfaces of the substrate 13. The integrated circuit 17 is recessed into the module and protected by a cover plate (not shown in FIG. 1), and the linear array of indicating elements is protected by an elongated translucent plastic cap 37, which covers the indicating elements 15 when attached to the upper portion of the substrate. The cross-sectional thickness of the module is small, on the order of 0.100 inch. This dimension is made the same as the center-to-center spacing of the indicating elements, so that the spacing between adjacent indicating elements in a single module is the same as the spacing between adjacent indicating elements of adjacent modules. Thus there is provided a uniform light dot display field capable of displaying information with high resolution.

The configuration of the integrated circuit 17 and the input and output connections thereto for controlling the indicating elements 15 is described in detail in the aforementioned copending patent application Ser. No. 872,031. The control circuitry described in that patent application, in combination with the modular configuration, provides a highly versatile display capability.

Figure 2:
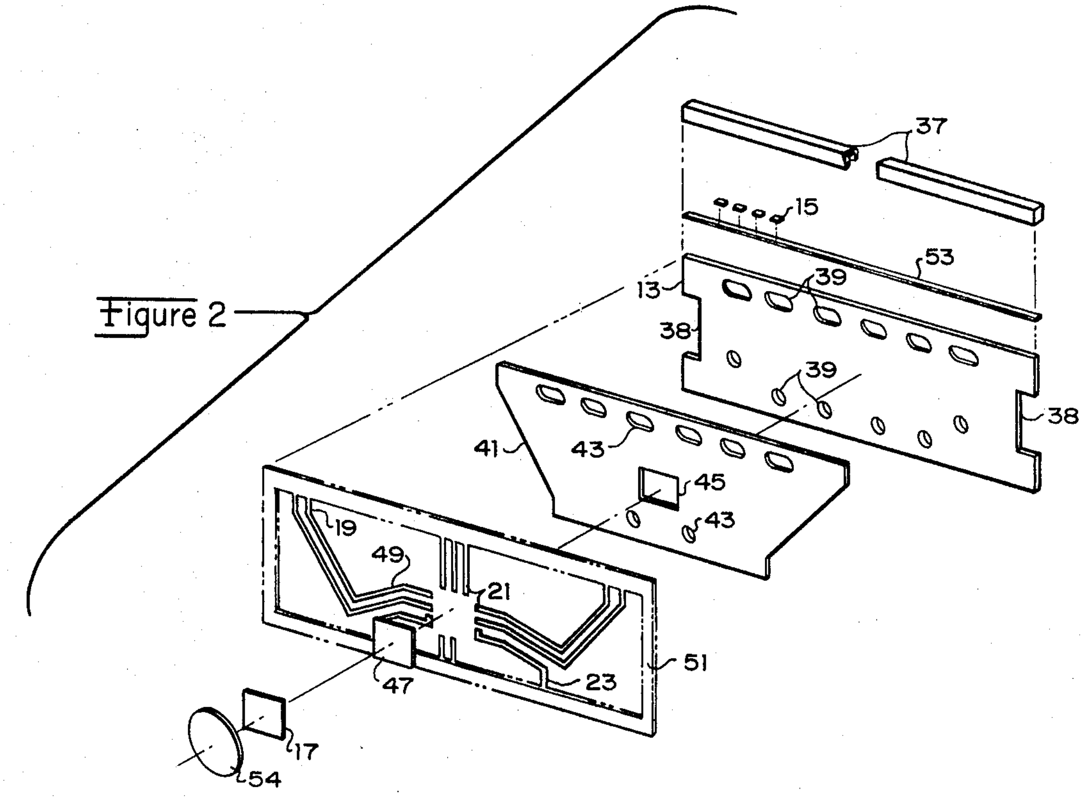
FIG. 2 is an exploded perspective view of the components of the module of FIG. 1.

FIG. 2 is an exploded view showing the components of the module assembly 11 of FIG. 1. The platelike substrate 13 is formed with notched end portions 38 and a plurality of apertures 39 therethrough. Overlaying the substrate 13 is a thin insulating film 41, preferably composed of a high temperature polyimide material coated on both sides with Teflon FEP. The insulating film 41 is configured with a plurality of apertures 43 which coincide with the apertures 39 in substrate 13. The film 41 also includes a central cutout 45 which exposes a portion of the substrate 13. On this exposed portion, there is mounted a metallic pad 47 having attached thereto the integrated circuit 17.

Overlaying the insulating film 41 is the aforementioned metal plane conductor pattern, designated in FIG. 2 by the reference numeral 49. As stated above, the conductor pattern 49 includes a first array of contact points 19 for connection to the indicating elements 15, a second array of contact points 21 for connection to the integrated circuit 17, and the third array of contact points 23 which form the input terminals to the module. The conductor pattern 49 is formed from a sheet of metal having a high tensile strength, preferably Kovar, as described below. The conductors of the pattern 49 are supported during assembly by a peripheral lead frame 51, shown in phantom lines, which is removed after assembly, as later described.

The plurality of indicating elements 15 are mounted in spaced-apart relation on a metal mounting strip 53, which may be Kovar, for example, and this mounting strip is turn attached to the top edge of the substrate 13.

As stated above, selected portions of the entire module assembly are encapsulated with a silicone compound material. This is achieved by a transfer molding process to form a thin layer of material which is securely held to the module assembly because during the molding process the silicone compound flows into the apertures and end notches of the substrate 13 and around the lower edge of the substrate and the array of input terminals 23. As shown in FIG. 1, the silicone compound is molded to expose selected areas, including the top edge of the substrate 13 and the indicating elements 15 mounted thereon, and the center cutout area containing the integrated circuit. After encapsulation, the translucent plastic cap 37 is positioned over the indicating elements 15, and a protective metal disc 54 is positioned over the integrated circuit 17.

Figure 3:
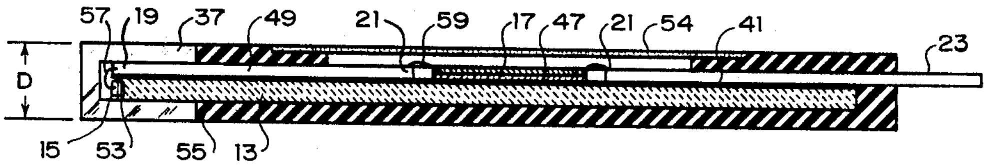
FIG. 3 is cross-sectional view taken vertically at DESCRIPTION center of the module of FIG. 1.

FIG. 3 is a cross-sectional view of the assembled and encapsulated module 11 taken vertically through the center thereof. This figure shows the silicone compound encapsulation 55 formed in a thin layer over the substrate 13 and the conductor pattern 49. The thickness of the silicone compound layer on each lateral surface of the module is typically 0.025 inches, and the overall thickness of the substrate 13 and overlaying insulating film and conductor pattern 49 is typically 0.050 inches, so that the total cross-sectional thickness is about 0.100 inches. From the figure, it can be seen that the indicating elements 15 are attached to the mounting strip 53 and protected by the translucent cap 37. Each indicating element has two electrical terminals one of which is connected to the common mounting strip 53 and the other of which is connected to one of the contact points 19 of the conductor pattern 49 by an individual gold wire 57. Similarly the integrated circuit 17 is mounted on its mounting pad 47 in electrical contact with the aluminum substrate 13 and connected to the contact points 21 of the conductor pattern 49 by individual wires 59. The conductor pattern 49 is insulated from the substrate by the thin insulating film 41. It can be seen that the aluminum substrate 13 serves as both a mounting base and a heat sink for the light emitting elements 15 and the integrated circuit chip 17. In addition, the substrate is an electrical conductor which connects selected terminals of the indicating elements and integrated circuit in common.

The integrated circuit 17 and the connections thereto are recessed below the exterior surface of the silicone compound encapsulating layer 55 and the protective metal disc 54 is set into a molded recessed portion of the layer to seal the integrated circuit from the external environment and to provide a smooth lateral surface for the module. All input signals for the module are received by the input terminals 23 which are formed by the conductor pattern 49 and extend through the encapsulating material at the bottom of the substrate 13. The output of the module is in the form of light projected upwardly from the indicating elements 15 at the top of the substrate 13.

The method of fabricating the module 11 and the various materials used therein will now be considered. As stated above, the substrate 13 is formed from a sheet of aluminum. The aluminum provides a good heat sink capability, is light in weight, and has a thermal coefficient of expansion compatible with that of the encapsulating silicone compound. The aluminum sheet is shaped with notches on the end portions thereof and drilled or punched to form apertures therein, for securing the encapsulating silicone compound. The sheet is plated first with nickel and then with silver to provide a suitable wetting surface for attachment of the mounting strip 53 and the mounting pad 47, as described below.

The insulating film 41 is used as both an insulator and a bonding material. This film is cut as shown in FIG. 2 to overlay the substrate 13. The film 41 is preferably a polyimide, i.e. polypyromellitimide, material coated on each side with Teflon FEP, i.e. fluorinated ethylenepropylene, to a thickness of one-half mil. Such a film is available commercially under the trade name Kapton Type F from the Dupont Corporation.

The conductor pattern 49 is stamped from a sheet of Kovar, a trade name of the Westinghouse Electric Corporation for a metal alloy containing substantially 54 percent iron, 29 percent nickel and 17 percent cobalt. The Kovar metal is stamped or chemically etched in a configuration to provide desired interconnection patterns between the indicating elements, the integrated circuit, and the input terminals to the module. Thereafter, the Kovar conductor pattern is gold plated, and the substrate 13, the insulating film 41 and the conductor pattern 49 are all suitably cleaned, as by rinsing them in a solution of trichloroethylene, acetone and D. I. water and drying them in an oven at a temperature of 60°—75° C. for 15 minutes to insure that all surfaces to be bonded are free of contaminants.

The substrate 13, the insulating film 41 and the conductor pattern 49 are then aligned in an overlaying fashion with the insulating film positioned between the substrate and the conductor pattern. This assembly is then bonded together by softening the Teflon FEP coating on the insulating film and pressing the substrate and the conductor pattern together. The insulating film is softened by heating it to a temperature in the range of 290°—320° C. It has been found that at temperatures lower than 290° C., the Teflon coating does not soften sufficiently and at temperatures above 320° C. the coating becomes too liquid to form a satisfactory bond. The assembly is pressed together using a pressure in the range of 275—350 pounds per square inch. A satisfactory bond is achieved by maintaining a temperature and pressure in the aforementioned range for a period of at least 5 minutes. For this purpose, a preheated bonding press may be used. Thereafter, while the pressure is still maintained, the assembly is cooled to a temperature below 200° C., after which the pressure is removed.

Next the excessive Kapton insulating film along the sides of the conductor pattern on the substrate is removed, as by cutting off the excess film with a knife or a razor blade and removing it with a pair of tweezers. Then the lead frame 51 is removed from the conductor pattern by cutting the contact points 19 and the input terminals 23 with a sheet metal shear.

The next step is to encapsulate selected areas of the substrate and conductor pattern assembly with a silicone thermosetting molding compound, preferably polyorganosiloxane with a small quantity of filler material. This may be accomplished by a conventional transfer molding process as described for example in Chapter 4 of a book entitled *Plastic Engineering Handbook* of the Society of the Plastic Industry, Incorporated, third edition published by the Reinhold Publishing Corporation, 1960. According to this process, the substrate and conductor pattern assembly is placed in a mold cavity into which liquified silicone compound is admitted and pressed onto the assembly to form a layer about 0.025 inch thick. As described above, this thin layer is securely held onto the assembly because the silicone compound is pressed into the notched end portions 38 and the apertures 39 and around the bottom edge of the substrate. The transfer mold is configured to prevent encapsulation of the top edge of the substrate 13, the contact points 19, the mounting area for the integrated circuit 17, the array of contact points 21 surrounding this mounting area, the input terminals 23, and the lower corner portions 31 of the substrate. Thereafter, excess silicone compound is removed, using a pair of tweezers for example, and the exposed portions of the substrate and the input terminals are cleaned using an abrasive powder such as S. S. White No. 9 glass beads, with an airbrasive unit, followed by an ultrasonic cleaning in D. I. water for a period of 5 minutes.

The mounting pad 47 is a gold plated Kovar sheet and the integrated circuit 17 is attached thereto by a conventional die-attaching process. According to this process, a gold-silicon eutectic preform, i.e. a thin sheet of metal, is placed between the pad and the integrated circuit and the assembly is heated to a temperature of 380° C. to melt the preform. The circuit may be mechanically moved back and forth across the mounting pad (i.e. scrubbed) to break up and displace oxidation at the component interfaces to insure wetting of the eutectic alloy to the integrated circuit and pad. During this process, the area being bonded may be maintained in an atmosphere of inert gas, such as argon, to prevent oxidation buildup of the bonding alloy and bonding surfaces. When the assembly is cooled, a good intermetallic bond is formed. Thereafter, the Kovar mounting pad 47, with the integrated circuit 17 attached thereto, is positioned on the substrate 13 with a gold-tin eutectic preform between them, then heated to about 285° C. scrubbed back and forth and finally cooled to form a bond. The Kovar pad acts as a thermal expansion buffer to minimize stress in the integrated circuit caused by thermal mismatch between the aluminum substrate and the silicon material in the semiconductor integrated circuit.

The mounting strip 53 is gold plated Kovar strip. The indicating elements 15 are first die-attached to the strip and the assembly is then bonded to the upper edge of the substrate, in the same manner as described above for the mounting pad and integrated circuit. Preferably, a mounting fixture is employed to achieve proper center-to-center spacing between adjacent indicating elements during the die-attaching process. Also, a fixture may be used to hold the substrate and the indicating element assembly during the process of bonding them together.

After the integrated circuit 17 and the assembly of indicating elements are mounted on the substrate, they are connected to the associated contact points of the conductor pattern 49 with fine gold wires, typically 0.100 inch in diameter, by a thermocompression bonding process, as described, for example, in British Pat. No. 1,056,362, issued Jan. 25,1967. This bonding is achieved by maintaining the temperature of the substrate at 120° C. and by feeding the wire to the contact points through a capillary which is maintained at a temperature of 298° C. and provides a bonding pressure of 125 grams.

Finally, the elongated translucent cap 37 is positioned over the indicating elements 15 and attached to the upper portion of the substrate 13 by a suitable adhesive. Similarly, the disc 53 is positioned over the integrated circuit 17 and secured to the silicone compound encapsulating layer.

It is to be noted that according to the method of fabricating the module described above, first the substrate 13 and conductor pattern 49 are bonded together, and thereafter, the integrated circuit chip 17 and indicating elements 15 are mounted on the substrate. In addition, the integrated circuit 17 and the indicating elements 15 are mounted on the substrate by using two separate steps, i.e. a die-attaching step and a bonding step. This sequence of assembly steps minimizes thermal stress in the module and also permits manufacturing control and enables the individual indicating elements to be replaced using soldering techniques at temperatures low enough to prevent melting of the bond of other elements on the substrate. The aluminum substrate and the silicone compound have similar coefficients of thermal expansion, so that after the encapsulated assembly is cooled, the encapsulating layer adheres tightly to the substrate without separating therefrom. The completed module is a mechanically sturdy, integral unit which may be used as a plug-in replaceable part. As described above, a large number of the modules may be stacked side-by-side and end-on-end to produce a very compact high-density array of components utilizable, for example, as a large field visual display.

We claim:

1. A miniaturized module assembly comprising:

a thermally and electrically conductive plate member having lateral and edge surfaces;

an insulating film overlaying and bonded to a lateral surface of said plate member, said film being apertured to expose a portion of the lateral surface;

an integrated circuit chip bonded to said exposed portion of the lateral surface of said plate member in electrical and thermal contact therewith;

a display assembly including:

an electrically conductive elongated mounting strip;

a plurality of indicating elements attached in spaced-apart relation in a linear array on said mounting strip;

said mounting strip and attached indicating elements being bonded onto an edge of said plate member;

a metal plane conductor pattern overlaying and bonded to said insulating film, said conductor pattern having a first array of contact points disposed along said edge of said plate member and connected to said plurality of indicating elements, a second array of contact points disposed about the periphery of said exposed portion of the lateral surface and connected to said integrated circuit chip, and a third array of contact points forming end terminals projecting from another edge of said plate member for coupling electrical input signals to said indicating elements and said integrated circuit chip; and a plastic insulating material providing a thin encapsulating layer over selected areas of said plate member and said metal plane conductor pattern.

2. The module assembly of claim 1:

said plate member having a plurality of apertures therethrough communicating between said lateral surfaces;

said insulating film having apertures coinciding with said plurality of apertures in said plate member; and said plastic encapsulating material being formed into said apertures to securely hold said thin encapsulating layer.

3. The module assembly of claim 2, wherein said plate member is formed from an aluminum sheet.

4. The module assembly of claim 2, said encapsulating material being formed to expose said first, second and third arrays of contact points, said indicating elements, and said integrated circuit chip.

5. The module assembly of claim 4, further including:

a cover plate overlaying said integrated circuit chip; and an elongated translucent cap covering said linear array of indicating elements and said first array of contact points connectable to said indicating elements.

6. The module assembly of claim 1, wherein said insulating film is formed of a polyimide material coated on both sides with fluorinated ethylenepropylene.

7. In a method of making a module assembly the steps comprising:

forming a first sheet of metal into a substrate;

forming a second sheet of metal into a conductor pattern;

shaping an insulating film of polyimide material coated on both sides with a temperature sensitive bonding material to overlay a lateral surface of said substrate and to expose a portion of said lateral surface through at least one aperture in said film;

bonding said conductor pattern to said lateral surface of said substrate by placing therebetween said film of coated polyimide material, pressing said substrate and said conductor pattern together with a predetermined pressure, and applying heat at a predetermined temperature to soften said bonding material coatings;

encapsulating selected portions of the bonded substrate and conductor pattern by molding a layer of silicone compound thereon;

attaching a plurality of indicating elements in a linear array onto a metal mounting strip, and bonding said mounting strip onto said exposed edge of said sheet metal substrate; and attaching an integrated circuit chip to a metal mounting pad and bonding said mounting pad to the exposed lateral surface portion of said substrate;

whereby thermal stress on the module components is minimized during fabrication of the module.

8. The method of claim 7, wherein said temperature sensitive bonding material coating on both sides of said polyimide material is fluorinated ethylenepropylene.

9. The method of claim 7, wherein the first bonding step includes pressing said substrate and said conductor pattern together with a pressure of 275 to 350 pounds per square inch and applying heat at a temperature of 290° to 320° C. for a time period not less than 5 minutes.

10. The method of claim 7, wherein after the steps of forming a substrate and shaping an insulating film there is further included the step of making a plurality of holes through said substrate and said overlaying insulating film, and wherein the step of encapsulating includes molding said silicone compound into said holes to securely hold the encapsulating layer on said substrate and said conductor pattern.